(12) United States Patent
Muto et al.

(10) Patent No.: US 6,965,428 B2
(45) Date of Patent: Nov. 15, 2005

(54) STAGE APPARATUS, EXPOSURE APPARATUS, AND SEMICONDUCTOR DEVICE MANUFACTURING METHOD

(75) Inventors: Yasuyo Muto, Tochigi (JP); Kazunori Iwamoto, Tochigi (JP); Yukio Takabayashi, Saitama (JP); Takashi Meguro, Tochigi (JP)

(73) Assignee: Canon Kabushiki Kaisha, Tokyo (JP)

(*) Notice: Subject to any disclaimer, the term of this patent is extended or adjusted under 35 U.S.C. 154(b) by 0 days.

(21) Appl. No.: 10/704,638

(22) Filed: Nov. 12, 2003

(65) Prior Publication Data

US 2004/0124594 A1 Jul. 1, 2004

(30) Foreign Application Priority Data

Nov. 13, 2002 (JP) .................................... 2002-329701

(51) Int. Cl.⁷ .......................... G03B 27/58; G03B 27/62
(52) U.S. Cl. ....................................... 355/72; 355/75
(58) Field of Search ...................... 355/72–76; 310/10, 310/12; 378/34, 35

(56) References Cited

U.S. PATENT DOCUMENTS

| | | | |
|---|---|---|---|
| 4,737,824 A | * | 4/1988 | Sakai et al. .................... 355/53 |
| 5,160,961 A | | 11/1992 | Marumo et al. ............... 355/53 |
| 5,191,218 A | | 3/1993 | Mori et al. ............. 250/453.11 |
| 5,231,291 A | | 7/1993 | Amemiya et al. ........ 250/443.1 |
| 5,608,773 A | * | 3/1997 | Korenaga et al. ............. 378/34 |
| 5,883,932 A | | 3/1999 | Chiba et al. .................. 378/34 |
| 5,923,408 A | | 7/1999 | Takabayashi ................ 355/53 |
| 5,999,589 A | | 12/1999 | Chiba et al. .................. 378/34 |

* cited by examiner

Primary Examiner—Henry Hung Nguyen
(74) Attorney, Agent, or Firm—Fitzpatrick, Cella, Harper & Scinto

(57) ABSTRACT

A stage apparatus has a substrate holding unit which chucks and holds a substrate, and includes a flat surface having a recess where the substrate holding unit is to be mounted. A fixing member fixes a projection support provided to the substrate holding unit onto the flat surface. The substrate holding unit is supported by the fixing member while a distal end of the projection support is in contact with the recess of the flat surface and the remaining portion of the substrate holding unit is not in contact with the flat surface.

23 Claims, 15 Drawing Sheets

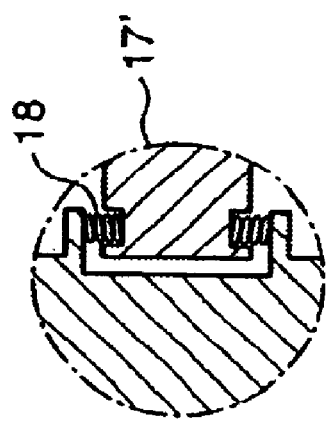
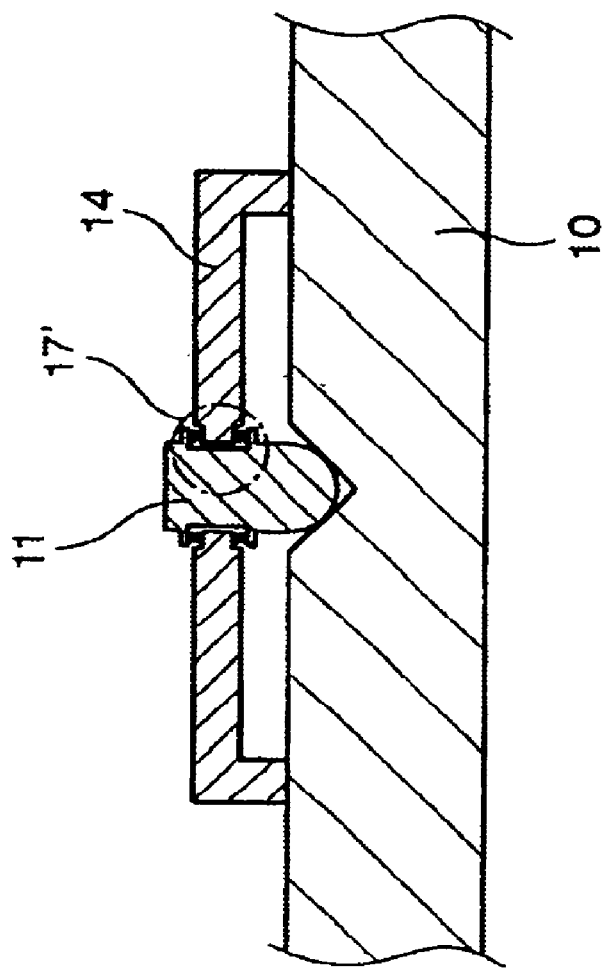
FIG. 10B
FIG. 10A

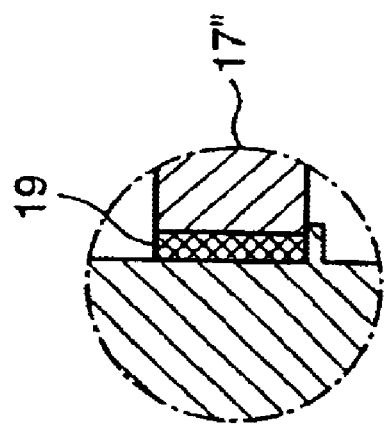
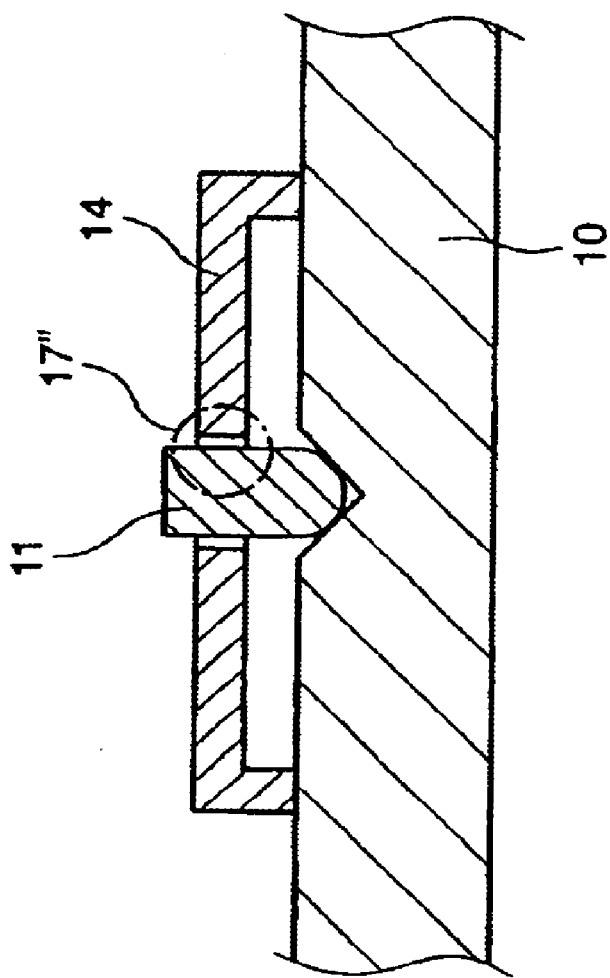
FIG. 11B
FIG. 11A

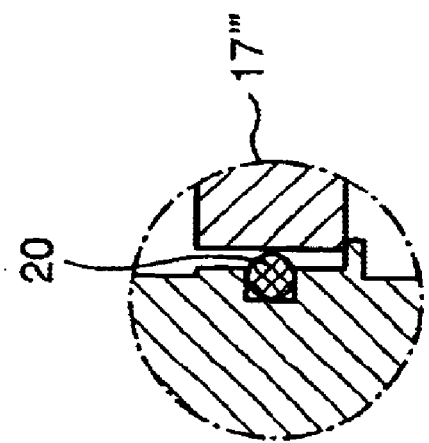
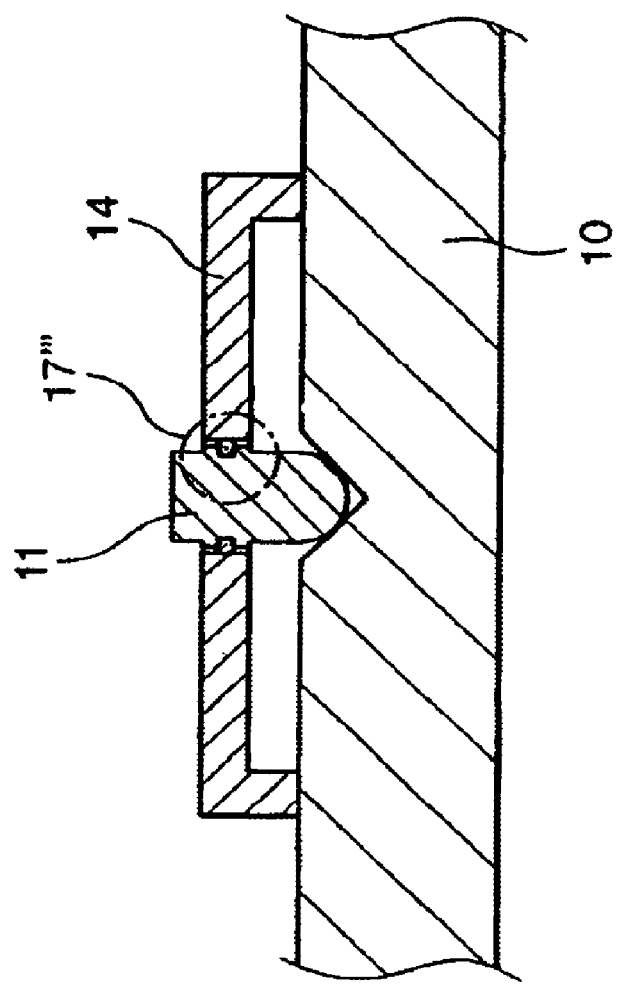
FIG. 12B
FIG. 12A

STAGE APPARATUS, EXPOSURE APPARATUS, AND SEMICONDUCTOR DEVICE MANUFACTURING METHOD

FIELD OF THE INVENTION

The present invention relates to a stage apparatus, an exposure apparatus, and a semiconductor device manufacturing method.

BACKGROUND OF THE INVENTION

In recent years, the semiconductor industry has been changing and progressing very fast. Accordingly, a semiconductor manufacturing apparatus that can further shrink the feature size and improve the throughput of elements has been sought. To meet the demand for a smaller element feature size, the numerical aperture (NA) of the lens has been increased. To manufacture high-performance elements with high productivity, an increase in the diameter of the substrate and the like have been performed.

For example, currently, an exposure system having two stages has been proposed to improve the throughput and alignment accuracy. This is an exposure system that transports and transfers a whole substrate holding unit between two stages as it holds a substrate. More specifically, according to this exposure system, alignment is performed at the first stage, and exposure is performed at the second stage different from the first stage during alignment. This makes it possible to ensure high-accuracy alignment time and improve the throughput.

To ensure the superiority of this system, first, the reproducibility of the surface of the substrate holding unit on different stages must be ensured reliably. More specifically, the substrate holding unit must be held between the first stage (alignment stage) and second stage (exposure stage) without changing the surface state of the substrate holding unit, e.g., the surface accuracy, distortion, or the like. Furthermore, the substrate holding unit must be moved between the stages quickly and must be stationarily held on or removed from a support surface for the substrate holding unit instantaneously.

In general, however, when the substrate holding unit and a support surface for it are to be brought into total contact with each other, it is difficult to stationarily hold the substrate holding unit on the support surface or to remove it from the support surface instantaneously. The substrate holding unit is highly likely to conform to the shape of the support surface for it. To reliably, stationarily hold the substrate holding unit, after it has moved from a stage, on the support surface for it, the substrate holding unit needs a stationary fixing force that can withstand stage driving. To ensure the reproducibility of the surface of the substrate holding unit at the second stage different from the first stage, when the substrate holding unit is to be moved between the stages or is to be stationarily held on or removed from the support surface for it, a power that changes the surface of the substrate holding unit should not be applied to the substrate holding unit. In a conventional exposure system, however, when the substrate holding unit is to be moved between the stages or is to be stationarily held on or removed from the support surface for it instantaneously, it is difficult to ensure the reproducibility of the surface of the substrate holding unit on different stages without changing the surface of the substrate holding unit.

SUMMARY OF THE INVENTION

The present invention has been made in view of the above problems, and has as its object to improve the throughput.

The first aspect of the present invention relates to a stage apparatus, having a substrate holding unit which chucks and holds a substrate, comprising a flat surface having a recess where the substrate holding unit is to be mounted, and a fixing member which fixes a projection support provided to the substrate holding unit onto the flat surface, wherein the substrate holding unit is supported by the fixing member while a distal end of the projection support is in contact with the recess of the flat surface and a remaining portion of the substrate holding unit is not in contact with the flat surface.

According to a preferred embodiment of the present invention, the fixing member preferably has a mechanism which applies no moment force to the projection support.

According to a preferred embodiment of the present invention, the recess is preferably a V-shaped groove, and the projection support preferably comes into point contact with the V-shaped groove at a distal end thereof.

According to a preferred embodiment of the present invention, the projection support preferably comprises at least three projection supports and the fixing member fixing the projection supports, respectively.

According to a preferred embodiment of the present invention, the projection support and the fixing member preferably form one component.

According to a preferred embodiment of the present invention, the fixing member is preferably fixed to the projection support.

According to a preferred embodiment of the present invention, the fixing member can preferably tilt freely at a contact portion with the projection support in an axial direction of the projection support and in a planar direction.

According to a preferred embodiment of the present invention, a small gap is preferably present between the projection support and the fixing member, and the projection support can preferably tilt freely in an axial direction of the projection support and in a planar direction because of the gap.

According to a preferred embodiment of the present invention, the fixing member preferably has one of a circular shape, an elliptical shape, a shape similar to an ellipse, or a polygonal shape.

According to a preferred embodiment of the present invention, the fixing member can preferably elastically deform.

According to a preferred embodiment of the present invention, the fixing member preferably has an outer seal portion on an outer surface thereof, and the outer seal portion preferably comes into contact with the flat surface to define a closed space.

According to a preferred embodiment of the present invention, a seal member is preferably arranged between the projection support and the fixing member.

According to a preferred embodiment of the present invention, the V-shaped groove is preferably formed to extend in three directions on the flat surface at an angular interval of about 120°.

According to a preferred embodiment of the present invention, the stage apparatus preferably has a chucking/holding mechanism which chucks and holds the projection support onto the flat surface.

According to a preferred embodiment of the present invention, the stage apparatus preferably has a chucking/holding mechanism which chucks and holds the projection support onto the substrate holding unit.

According to a preferred embodiment of the present invention, the projection support can preferably be removed from the flat surface by canceling a chucking/holding force from the chucking/holding mechanism.

According to a preferred embodiment of the present invention, the projection support can preferably be removed from the substrate holding unit by canceling a chucking/holding force from the chucking/holding mechanism.

According to a preferred embodiment of the present invention, the chucking/holding mechanism preferably uses one of a negative pressure, a Coulomb force, and a magnetic force.

The second aspect of the present invention relates to a stage apparatus, having a substrate holding unit which chucks and holds a substrate, comprising a flat surface having a projection support where the substrate holding unit is to be mounted, and a fixing member which fixes the projection support provided to the flat surface with a recess formed in the substrate holding unit, wherein the substrate holding unit is supported by the fixing member while the recess of the substrate holding unit is in contact with a distal end of the projection support and a remaining portion of the substrate holding unit is not in contact with the flat surface.

The third aspect of the present invention relates to an exposure apparatus comprising an optical system which projects exposure light irradiating a master having a pattern onto a substrate, and a stage apparatus having a substrate holding unit which holds the substrate or master, wherein the stage apparatus includes a stage, a flat surface which drives the substrate holding unit within a predetermined plane, and a fixing member which fixed a projection support formed on the substrate holding unit onto the flat surface, and the substrate holding unit is supported while a distal end of the projection support is in contact with the flat surface and the substrate holding unit is not in contact with the flat surface.

The fourth aspect of the present invention relates to a semiconductor device manufacturing method comprising an applying step of applying a photosensitive material on a substrate, an exposure step of transferring a pattern onto the substrate, applied with the photosensitive material in the applying step, by utilizing the exposure apparatus, and a developing step of developing the photosensitive material on the substrate where the pattern has been transferred in the exposure step.

Other features and advantages of the present invention will be apparent from the following description taking in conjunction with the accompanying drawings, in which like reference characters designate the same or similar parts throughout the figures thereof.

BRIEF DESCRIPTION OF THE DRAWINGS

The accompanying drawings, which are incorporated in and constitute a part of the specification, illustrate embodiments of the invention and, together with the description, serve to explain the principles of the invention.

FIGS. 10A and 10B are enlarged views of a portion in the vicinity of a projection support for a wafer chuck;

FIGS. 11A and 11B are enlarged views of a portion in the vicinity of a projection support for a wafer chuck;

FIGS. 12A and 12B are enlarged views of a portion in the vicinity of a projection support for a wafer chuck;

DETAILED DESCRIPTION OF THE PREFERRED EMBODIMENTS

The preferred embodiments of the present invention will be described in detail with reference to the accompanying drawings.

(First Embodiment)

A stage apparatus according to the first preferred embodiment of the present invention will be described in detail.

Figure 1:
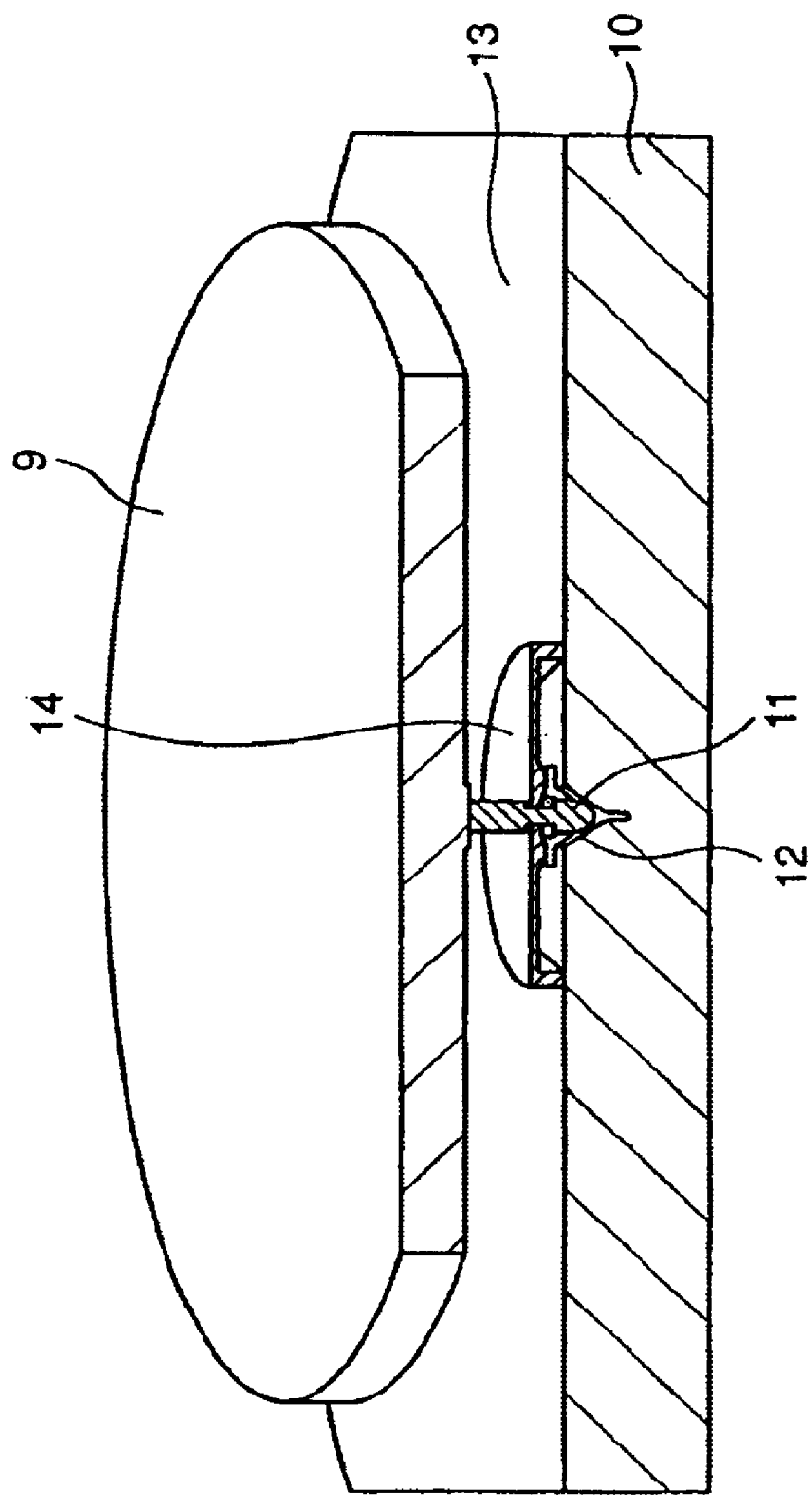
FIG. 1 is a view showing a stage apparatus according to a preferred embodiment of the present invention.

FIG. 1 is a schematic view showing the stage apparatus according to the preferred embodiment of the present invention. This stage apparatus has a flat surface 13 for driving a substrate holding unit (wafer chuck) 9 within a predetermined plane, and a fixing member 14 for fixing a projection support 11 formed on the substrate holding unit 9 onto the flat surface 13. The substrate holding unit 9 is supported while the distal end of the projection support 11 is in contact with a recess (V-groove) 12 of the flat surface 13 and the main body of the substrate holding unit 9 is not in contact with the flat surface (wafer chuck support surface) 13. With this arrangement, the stage apparatus according to the preferred embodiment of the present invention drives the substrate holding unit 9 which chucks and holds a substrate.

The wafer chuck 9 has pin-shaped projection (not shown) interspersed on its support surface where a wafer 8 (see FIG. 13) as a substrate is to be placed. The wafer 8 is placed on the surfaces of the projections, and is held flat by a negative pressure or a Coulomb force. The wafer chuck 9 also has the projection support 11 for supporting the wafer chuck 9 on its surface opposite to the support surface where the wafer 8 is to be placed. The wafer chuck support surface 13 for placing the wafer chuck 9 has the fixing member 14, which supplies a force to only the projection support 11 with a chucking/holding force. The projection support 11 and the wafer chuck 9 may form one component, or separate components. As the chucking/holding force, a negative pressure, a Coulomb force, a magnetic force, or the likes, is preferably used.

The stage apparatus according to the preferred embodiment of the present invention is characterized in the following respects. Namely, as shown in FIG. 1, the wafer chuck 9 is supported through the projection support 11, the distal end of the projection support 11 to come into contact with the wafer chuck support surface 13 is spherical, and the V-groove 12 is formed in the wafer chuck support surface 13, so that the projection support 11 and the V-groove 12 of the wafer chuck support surface 13 come into point contact with each other. The stage apparatus is also characterized in that the chucking/holding force acting on the fixing member 14 fixes only the projection support 11.

Figure 2:
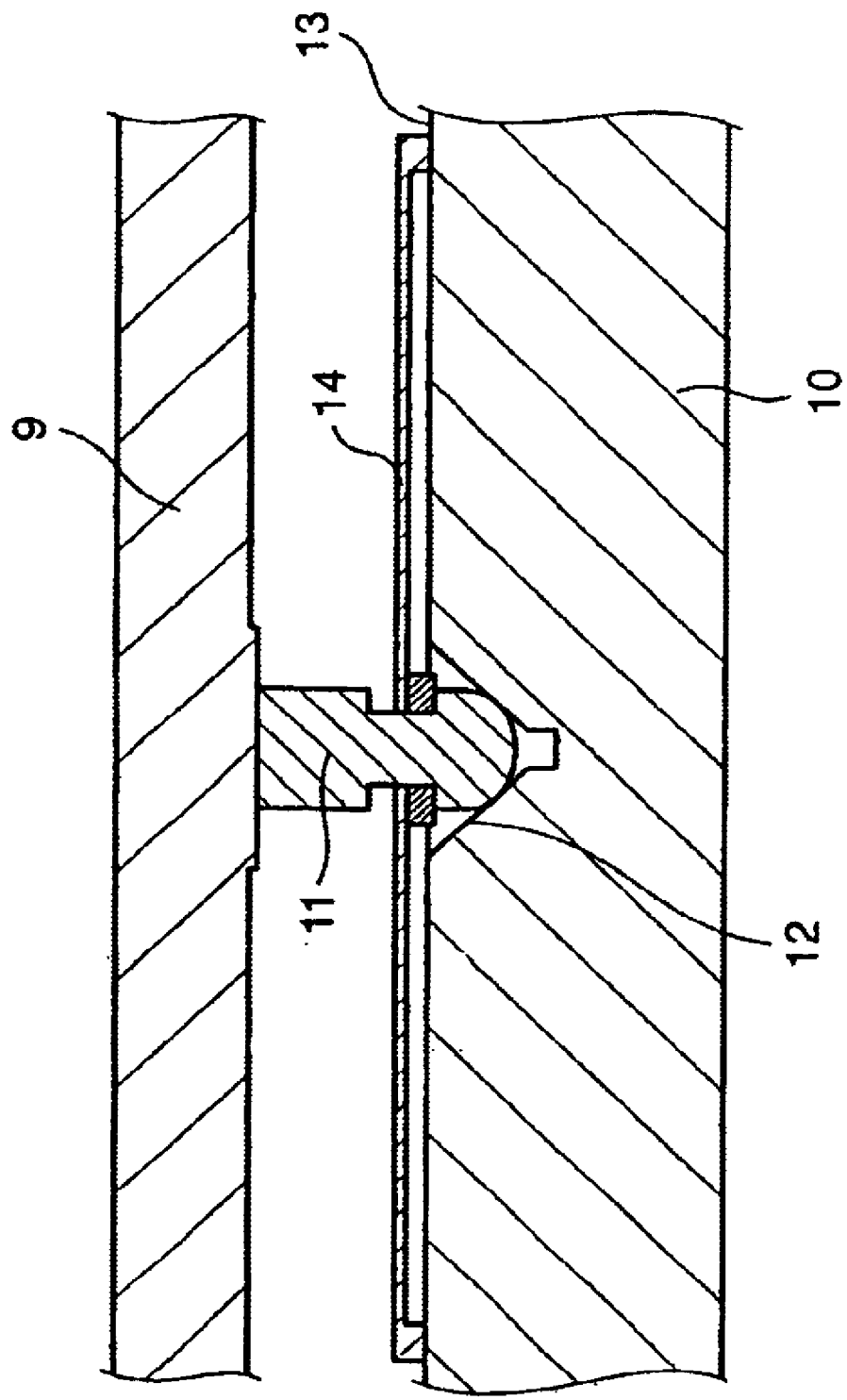
FIG. 2 is an enlarged view of a portion in the vicinity of a projection support for a wafer chuck.

FIG. 2 is an enlarged view of a portion in the vicinity of the projection support 11 for the wafer chuck 9. In FIG. 2, if there are three projection supports, the wafer chuck 9 is held at six points. As the projection support 11 and the V-groove 12 are in point contact with each other, no moment force is generated at the contact portion. The fixing member 14 also has a mechanism that applies no moment force to the projection support 11. The projection support 11 comes into contact with the V-groove 12 at a plurality of points (in this case, two points per projection support), so that the force acting on the projection support 11 can be dispersed. Therefore, deformation caused by contact stress is largely decreased when compared to a case wherein the projection support 11 is in contact with the V-groove 12 at one point. Since the contact area is small, dust is caught in the contact area at a low possibility.

Although the V-groove 12 of this embodiment has a V shape, the present invention is not limited to this. For example, any V-groove 12 will do as far as it is formed of two surfaces including an inclined surface and the projection support 11 slides on it by the weight of the wafer chuck 9 so that the position of the projection support 11 is determined. The open angle formed by the two surfaces may be 90°, or more than that, or less than that. The projection support 11 which comes into contact with the V-groove 12 of the wafer chuck support surface 13 preferably has a shape (e.g., a spherical shape) with which the contact portion of projection support 11 and the V-groove 12 of the wafer chuck support surface 13 forms point contact. If the moment force is small, the projection support 11 and wafer chuck support surface 13 may be formed to come into linear contact or surface contact with each other.

In this embodiment, the wafer chuck 9 has the projection support 11, and the V-groove 12 is formed in a stage 10. However, the present invention is not limited to this. For example, the relationship between the projection support 11 on the lower surface of the wafer chuck 9 and the V-groove 12 can be reversed. More specifically, the projection support 11 may be formed on the wafer chuck support surface 13, and the V-groove 12 may be formed in the lower surface of the wafer chuck 9. In this case, the projection support 11 for supporting the wafer chuck 9 is fixed to the wafer chuck 9. When the chucking/holding force is canceled, the projection support 11 can be released from the wafer chuck support surface 13. The projection support 11 for supporting the wafer chuck 9 may be fixed to the wafer chuck support surface 13. When the chucking/holding force is canceled, the projection support 11 can be released from the wafer chuck 9.

(Second Embodiment)

Figure 3:
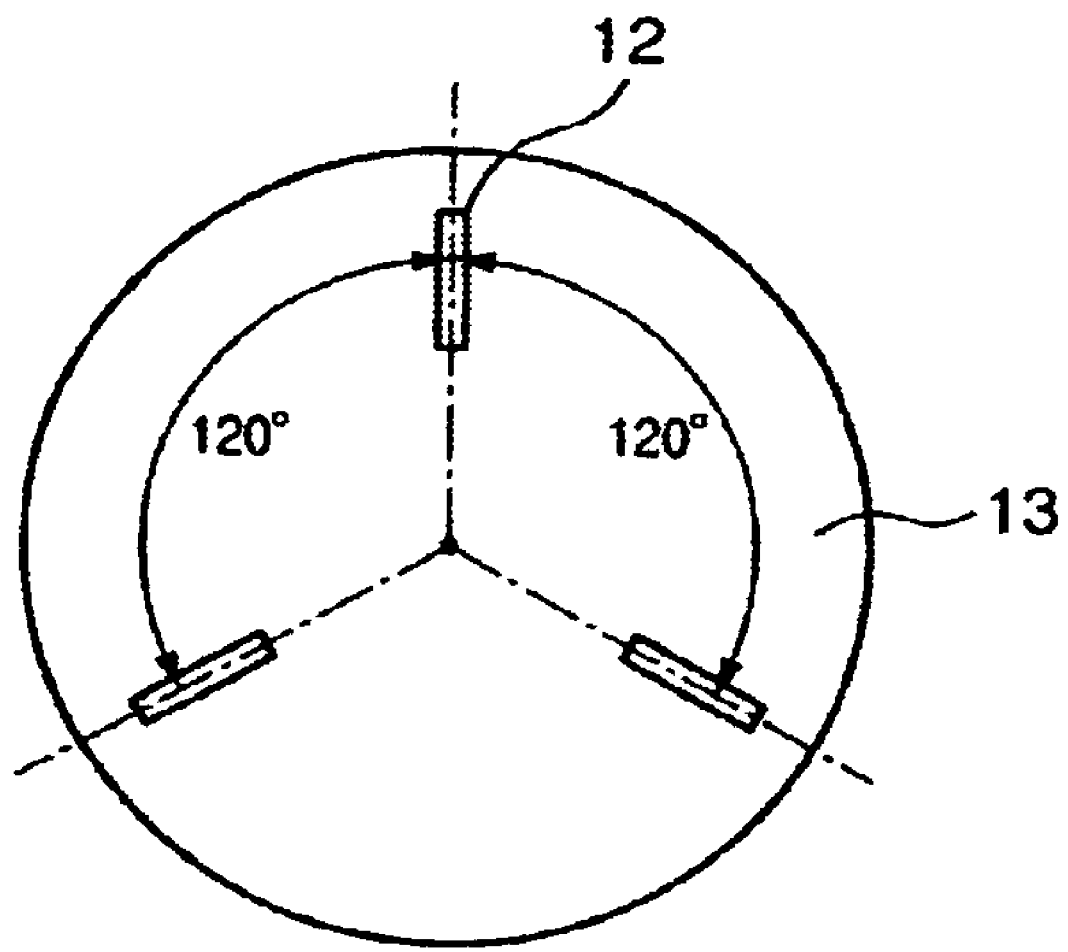
FIG. 3 is a view showing the arrangement of V-grooves on a wafer chuck support surface.

A stage apparatus according to the second preferred embodiment of the present invention is characterized in the following respects. Namely, as shown in FIG. 3, in an X-Y stage apparatus including a wafer chuck 9, which chucks and holds a wafer 8 by suction caused by a negative pressure or a Coulomb force, the surface of the wafer chuck 9 is supported on a wafer chuck support surface 13 at three points, so that the surface of the wafer chuck 9 is supported stably.

The wafer chuck 9 has three projection supports 11. As shown in FIG. 3, V-grooves 12 for receiving the respective projection supports 11 are arranged on the wafer chuck support surface 13 in three directions at an angular interval of about 120°. The position of the wafer chuck 9 is uniquely determined by its own weight. Hence, an abutment which is indispensable for positioning becomes unnecessary, and the reproducibility of the support position can be increased. When the wafer chuck 9 is supported and retained at three points, the wafer chuck 9 can be fixed stably. Also, as the wafer chuck 9 is supported at three points, the wafer chuck 9 conforms to the shape of the wafer chuck support surface 13 at a lower possibility compared to a case wherein the wafer chuck 9 is supported at its entire surface. Also, the possibility that distortion, heat, or vibration, which occurs on the wafer chuck support surface 13 in various manners during exposure or movement of the wafer chuck 9, adversely affect deformation, or the like, of the wafer chuck 9 decreases.

As described above, that the V-grooves 12 are arranged in three directions at an angular interval of about 120° and that the projection supports 11 and the V-grooves 12 of the wafer chuck support surface 13 come into point contact with each other are very effective to stably support the wafer chuck 9.

A fixing member 14 which holds the projection support 11 against the wafer chuck support surface 13 with a force that chucks and holds the wafer chuck 9 can define a closed space, when an outer seal portion present on its outer surface comes into contact with the wafer chuck support surface 13 with no gap. The fixing member 14 preferably has one of a circular shape, an elliptical shape, a shape similar to an ellipse, or a polygonal shape. The chucking/holding force acting on the fixing member 14 is preferably one of a negative pressure, a Coulomb force, and a magnetic force. When the chucking/holding force is a negative pressure, a closed space is needed. The suction force is obtained by vacuum (e.g., evacuation with a vacuum pump) from a vacuum hole (not shown) in the closed space defined by the fixing member 14 and wafer chuck support surface 13.

When leakage is prevented in the above manner, the projection support 11 can be chucked reliably to the wafer chuck support surface 13. The outer seal portion present on the outer surface of the projection support 11 can be incorporated in the following embodiments as well.

(Third Embodiment)

Figure 4:
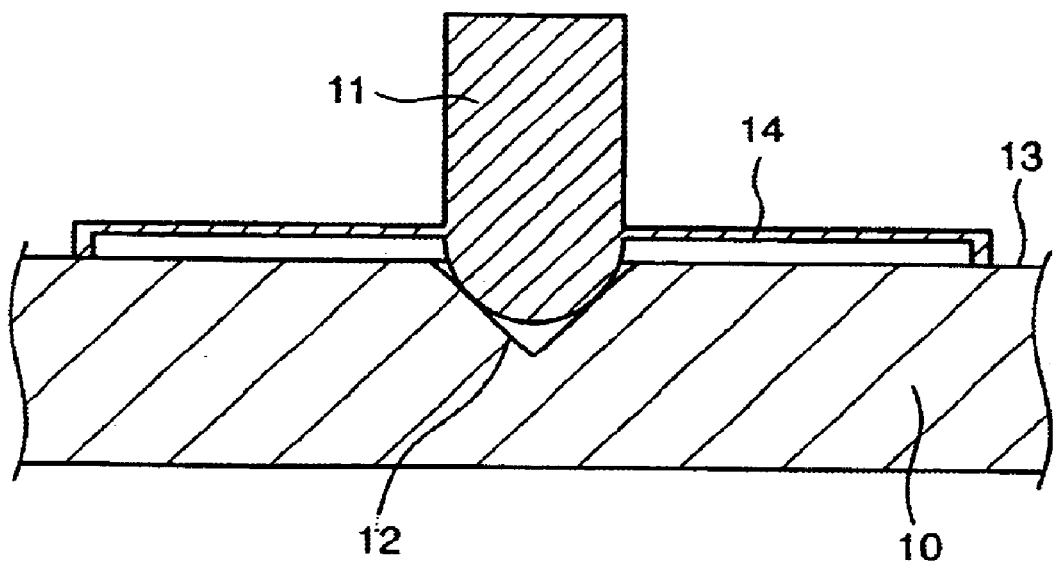
FIG. 4 is a view of a portion including a fixing member which ensures a wide surface area where a suction force acts.
Figure 5:
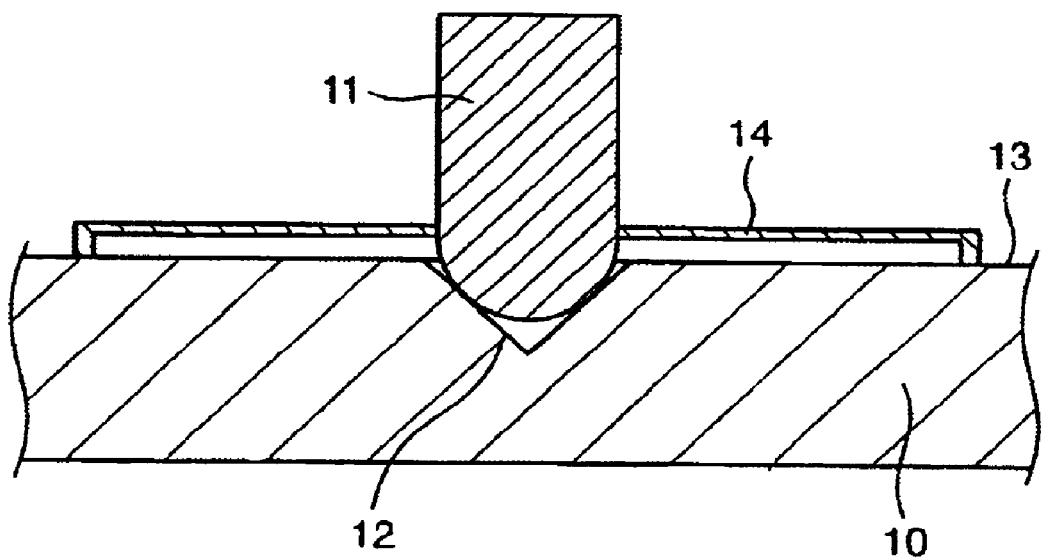
FIG. 5 is a view of a portion in which a fixing member, which ensures a wide surface area where a suction force acts, is a different component.

A stage apparatus according to the third preferred embodiment of the present invention includes a wafer chuck 9 which chucks and holds a wafer 8 with suction caused by a negative pressure or the Coulomb force, as shown in FIG. 4. A projection support 11 which supports the wafer chuck 9 and comes into contact with a V-groove 12 forms one component together with a fixing member 14. The projection support 11 to come into contact with the V-groove 12 is not limited to the one which forms one component together with the fixing member 14. For example, as shown in FIG. 5, the projection support 11 may be fixed to a fixing member 14 as a separate component.

(Fourth Embodiment)

A stage apparatus according to the fourth preferred embodiment of the present invention has a wafer chuck 9 which chucks and holds a wafer 8 by suction caused by a negative pressure or a Coulomb force. To prevent deformation of the surface of the wafer chuck 9 which is caused by the shape of a wafer chuck support surface 13, in this stage apparatus, a projection support 11 for supporting the wafer chuck 9 has an arrangement for absorbing or avoiding deformation.

In the stage apparatus according to this embodiment, a fixing member 14 can tilt freely at its contact portion in the axial direction of the projection support 11 and in the planar direction. When the fixing member 14 has the above degrees of freedom at its contact portion, a small gap is present at the contact portion of the projection support 11 and fixing member 14. This small gap allows the fixing member 14 to move freely.

When the projection support 11 has a fixing member 14 with a shape that ensures a wide surface area parallel to the wafer chuck support surface 13, the fixing member 14 can move freely at the contact portion with respect to the projection support 11.

Figure 6:
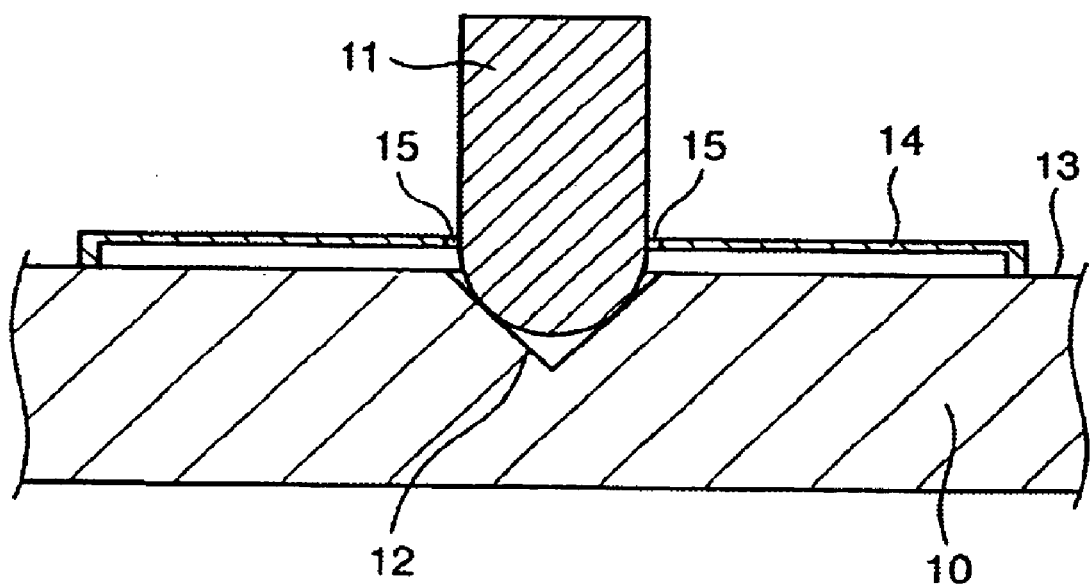
FIG. 6 is an enlarged view of a portion in the vicinity of a projection support for a wafer chuck.

As an example of the above arrangement, for example, in the stage apparatus according to this embodiment, as shown in FIG. 6, the fixing member 14 has a small gap 15 at the contact portion with respect to the projection support 11. This gap 15 allows the projection support 11 to move freely to a certain degree. The gap 15 has such a size that, when the fixing member 14 inclines with respect to the projection support 11, the projection support 11 will not come into contact with the fixing member 14 with this inclination. This arrangement can be applied to the following fifth to ninth embodiments as well.

(Fifth Embodiment)

Figure 7:
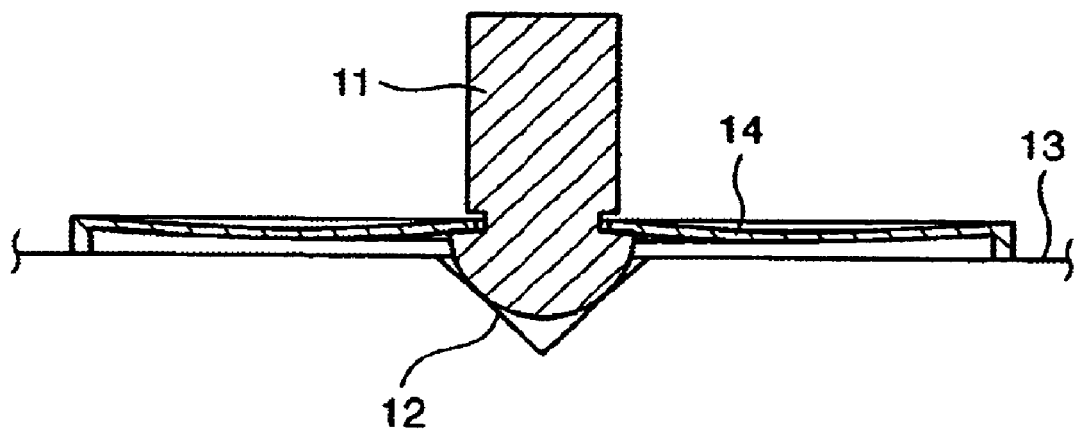
FIG. 7 is an enlarged view of a portion in the vicinity of a projection support for a wafer chuck.

A stage apparatus according to the fifth preferred embodiment of the present invention has a fixing member 14 which holds only a projection support 11 for a wafer chuck 9 with respect to a wafer chuck support surface 13. As shown in FIG. 7, the fixing member 14 can elastically deform by a chucking/holding force as a negative pressure. In this case, the fixing member 14 is preferably designed with such a thickness that it can elastically deform by the suction force. This arrangement can be one in which an elastic body or a variable-length material is incorporated in the projection support 11, or one in which a variable-length mechanism is incorporated in the projection support 11. When the fixing member 14 comes into contact with the wafer chuck support surface 13 and is chucked and held, the fixing member 14 is tilted to conform to the state of the wafer chuck support surface 13 at a high possibility. This, however, does not adversely affect the projection support 11 with a moment force or the like. This is because the moment force or the like is absorbed by the contact portion of the fixing member 14 with respect to the projection support 11, or by the elastic deformation of the fixing member 14 serving as the elastic body.

(Sixth Embodiment)

Figure 8B:
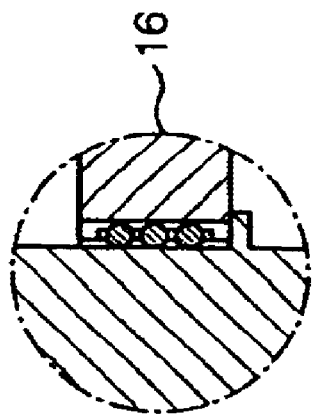
FIGS. 8A and 8B are enlarged views of a portion in the vicinity of a projection support for a wafer chuck.
Figure 8A:
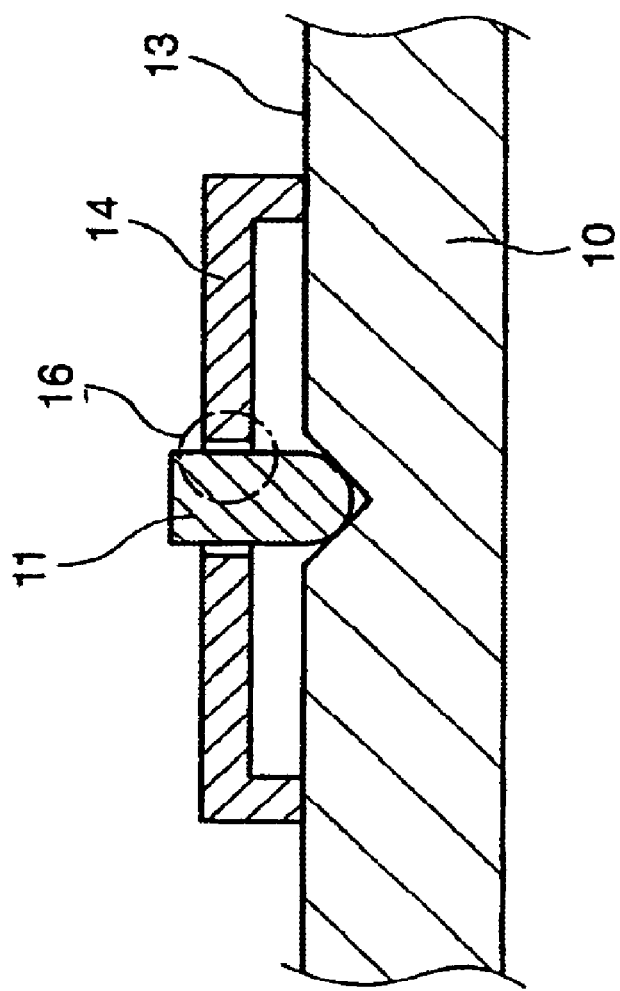

A stage apparatus according to the sixth preferred embodiment of the present invention is characterized in that, as shown in FIGS. 8A and 8B, a fixing member 14 incorporates a rolling mechanism 16 at its contact portion with respect to a projection support 11, so that the fixing member 14 can move freely with respect to the projection support 11. As the projection support 11 can vertically move smoothly with respect to the fixing member 14, the projection support 11 can be reliably chucked to a wafer chuck support surface 13 without any moment force from the fixing member 14.

(Seventh Embodiment)

Figure 9B:
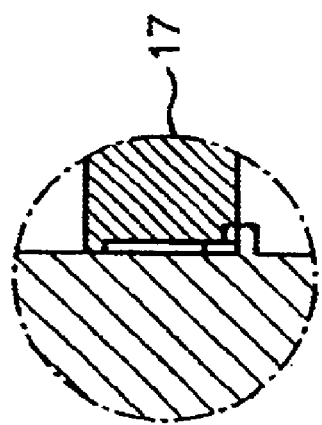
FIGS. 9A and 9B are enlarged views of a portion in the vicinity of a projection support for a wafer chuck.
Figure 9A:
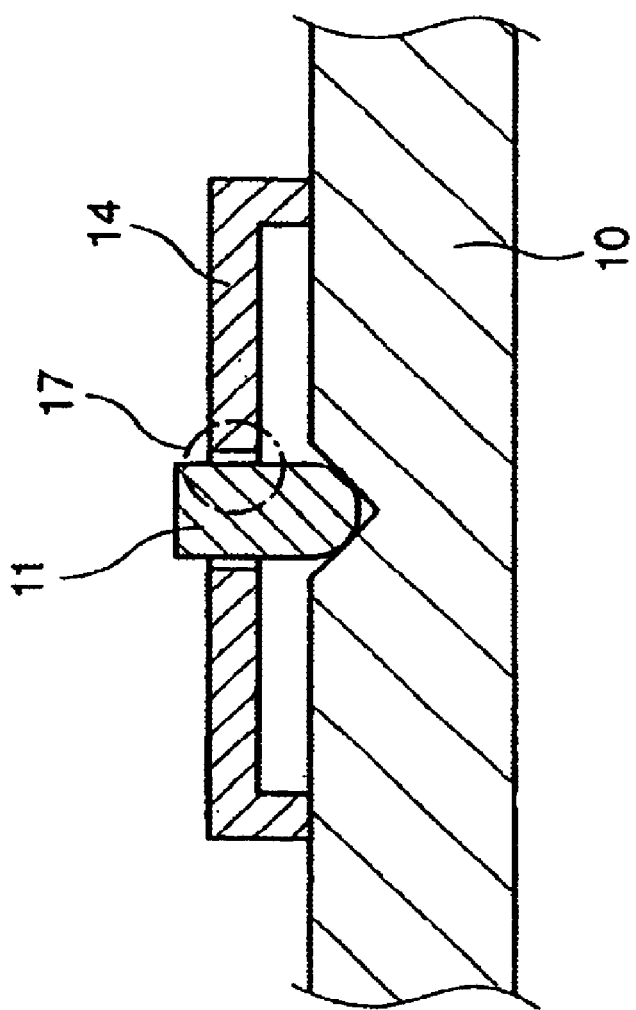

A stage apparatus according to the seventh preferred embodiment of the present invention is characterized in that, as shown in FIGS. 9A and 9B, a fixing member 14 incorporates a vertical slide mechanism 17 at its contact portion with respect to a projection support 11, so that the fixing member 14 can move freely with respect to the projection support 11 in the axial direction of the projection support 11. The vertical slide mechanism 17 is characterized in that it reduces frictional resistance, so that its contact area is small and its contact surface is smooth. Thus, the projection support 11 can be reliably chucked to a wafer chuck support surface 13 without any moment force from the fixing member 14.

(Eighth Embodiment)

A stage apparatus according to the eighth preferred embodiment of the present invention is characterized in that, as shown in FIGS. 10A and 10B, a fixing member 14 incorporates, at its contact portion with respect to a projection support 11, a vertical slide mechanism 17' having no contact portion, so that a projection support 11 can move freely with respect to the fixing member 14. For example, when the projection support 11 is fixed to the fixing member 14 with springs 18 or the like, the projection support 11 can be reliably chucked to a wafer chuck support surface 13 without any moment force from the fixing member 14.

(Ninth Embodiment)

A stage apparatus according to the ninth preferred embodiment of the present invention is characterized in that, as shown in FIGS. 11A and 11B, an elastic body 19 is provided at that portion of a projection support 11 which comes into contact with a fixing member 14, so that the projection support 11 can move freely. Thus, the projection support 11 can be reliably chucked to a wafer chuck support surface 13 without any moment force from the fixing member 14.

(10th Embodiment)

A stage apparatus according to the 10th preferred embodiment of the present invention is characterized in that, as shown in FIGS. 12A and 12B, a seal member 20 is arranged between a projection support 11 and fixing member 14 within a range not limiting the degrees of freedom. As the seal member 20, for example, an O-ring is used.

(11th Embodiment)

A stage apparatus according to the 11th preferred embodiment of the present invention includes a wafer chuck 9 which chucks and holds a wafer 8 by suction caused by a negative pressure or the Coulomb force. The wafer chuck 9 is placed on a wafer chuck support surface 13 through a projection support 11 which comes into contact with the wafer chuck support surface 13, and is chucked and placed by a negative pressure, the Coulomb force, or a magnetic force.

Since the wafer chuck 9 must be fixed on the wafer chuck support surface 13, not only is the wafer chuck 9 placed on the wafer chuck support surface 13, but also a force is applied to the projection support 11, which comes into contact with the wafer chuck support surface 13, thereby fixing the wafer chuck 9. As this force, a vacuum force, a Coulomb force, a magnetic force, or the like, is used. A mechanism that generates such a force is incorporated in the wafer chuck support surface 13 or the projection support 11. The mechanism which generates the force includes a mechanism such as a pump for generating a vacuum force, an electrode for generating the Coulomb force, an electromagnet for generating a magnetic force, and the like.

As described above, according to the present invention, a large integrated device can be manufactured stably with high productivity. With the stage apparatus according to the preferred embodiment of the present invention and the wafer chuck incorporated in it, the wafer chuck can be stationarily held on and removed from the support surface of the wafer chuck instantaneously. Thus, only the projecting support can be held and fixed without applying any force to the wafer chuck. The reproducibility of the surface of the wafer chuck on different stages can thus be obtained.

As described above, with the stage apparatus according to the preferred embodiment of the present invention, problems accompanying the increase in diameter of the wafer, high-speed movement of the wafer chuck, and the like, are solved, so that the throughput can be improved.

(Other Embodiment)
[Exposure Apparatus]

An example will be described wherein a stage apparatus according to a preferred embodiment of the present invention is applied to a reduction projection exposure apparatus.

Figure 13:
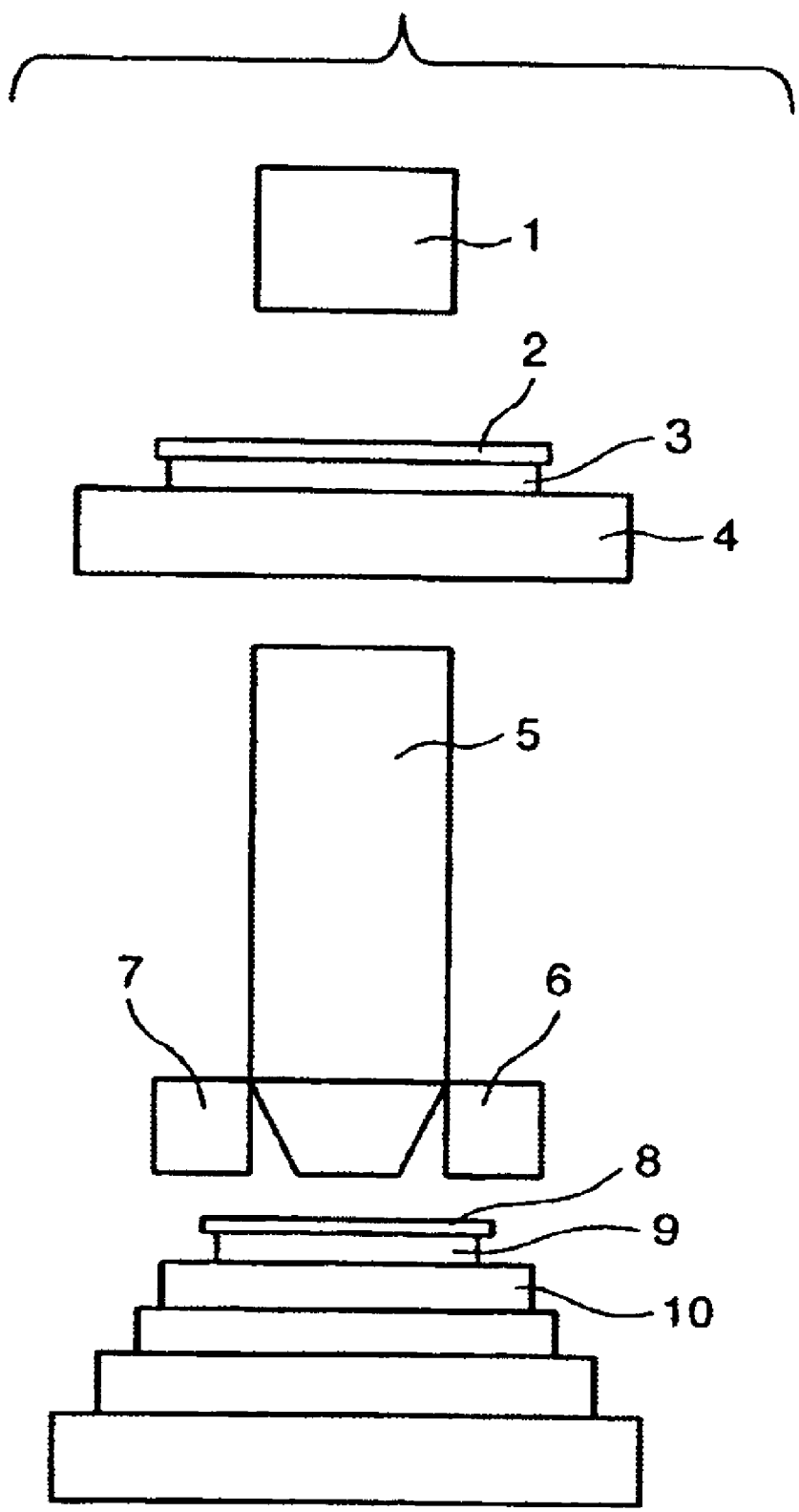
FIG. 13 is a conceptual view showing the arrangement of an exposure apparatus according to a preferred embodiment of the present invention.

FIG. 13 is a conceptual view showing the arrangement of an exposure apparatus according to a preferred embodiment of the present invention. As shown in FIG. 13, in this exposure apparatus, a reticle 2 as an exposure master is placed on a reticle stage 4, and is irradiated with exposure light guided from a light source (not shown) through an illumination optical system 1. The exposure light passing through the reticle 2 is reduced to ⅕ by a projection optical system 5, to irradiate a silicon substrate (wafer) or a wafer 8 as an object to be processed. A wafer chuck 9 serving as a substrate holding unit for holding the wafer 8 is placed on a stage 10 which can move the wafer 8 within a horizontal plane.

[Exposure Sequence]

The exposure sequence of the exposure apparatus will be described. After the wafer 8 as the exposure target is set in the exposure apparatus automatically or manually, the exposure apparatus starts operation upon reception of an exposure start command. First, the first wafer 8 is transported onto the wafer chuck 9 placed on the stage 10 by a transport system. Subsequently, a plurality of alignment marks on the wafer 8 are detected and measured by an off-axis scope 7 mounted on the stage 10. The magnification, rotation, and X-Y error amounts of the wafer 8 are determined, and the position of the wafer 8 is corrected. The stage 10 so moves as to set the first shot position of the wafer 8 chucked and held by the wafer chuck 9 to coincide with the exposure position. After the first shot position is focused by a surface measuring means 6, it is exposed for about 0.2 sec. The off-axis scope 7 steps to the second shot position on the wafer 8, and exposure is sequentially repeated. This sequence is performed repeatedly. When the final shot process is ended, an exposure process for one wafer 8 is completed. The wafer 8 is transferred from the wafer chuck to a recovery transport band, and is returned to the wafer carrier.

[Semiconductor Device Manufacturing Process]

Figure 14:
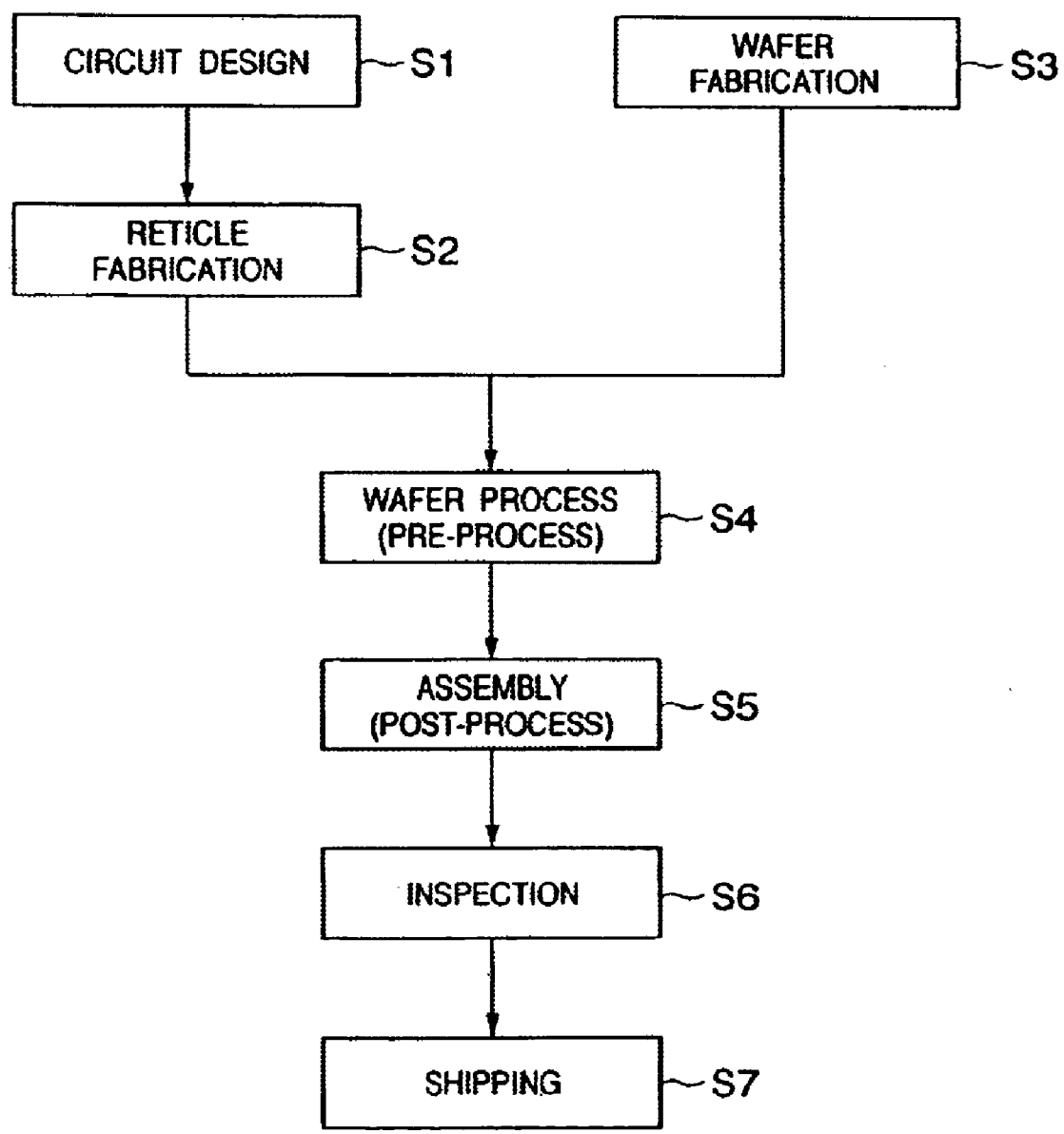
FIG. 14 is a flow chart showing the flow of an overall semiconductor device manufacturing process.

A semiconductor device manufacturing process utilizing the above exposure apparatus will be described. FIG. 14 is a flow chart of the flow of the overall semiconductor device manufacturing process. In step 1 (circuit design), circuit design of a semiconductor device is performed. In step 2 (mask fabrication), a mask is fabricated based on the designed circuit pattern. In step 3 (wafer fabrication), a wafer is manufactured by using a material such as silicon. In step 4 (wafer process), called a pre-process, an actual circuit is formed on the wafer by lithography by using the mask and wafer described above. In step 5 (assembly), called a post-process, a semiconductor chip is formed by using the wafer fabricated in step 4, and includes processes such as an assembly process (dicing and bonding) and a packaging process (chip encapsulation). In step 6 (inspection), inspections such as the operation confirmation test and durability test of the semiconductor device fabricated in step 5 are performed. After these steps, the semiconductor device is completed, and shipped (step 7).

Figure 15:
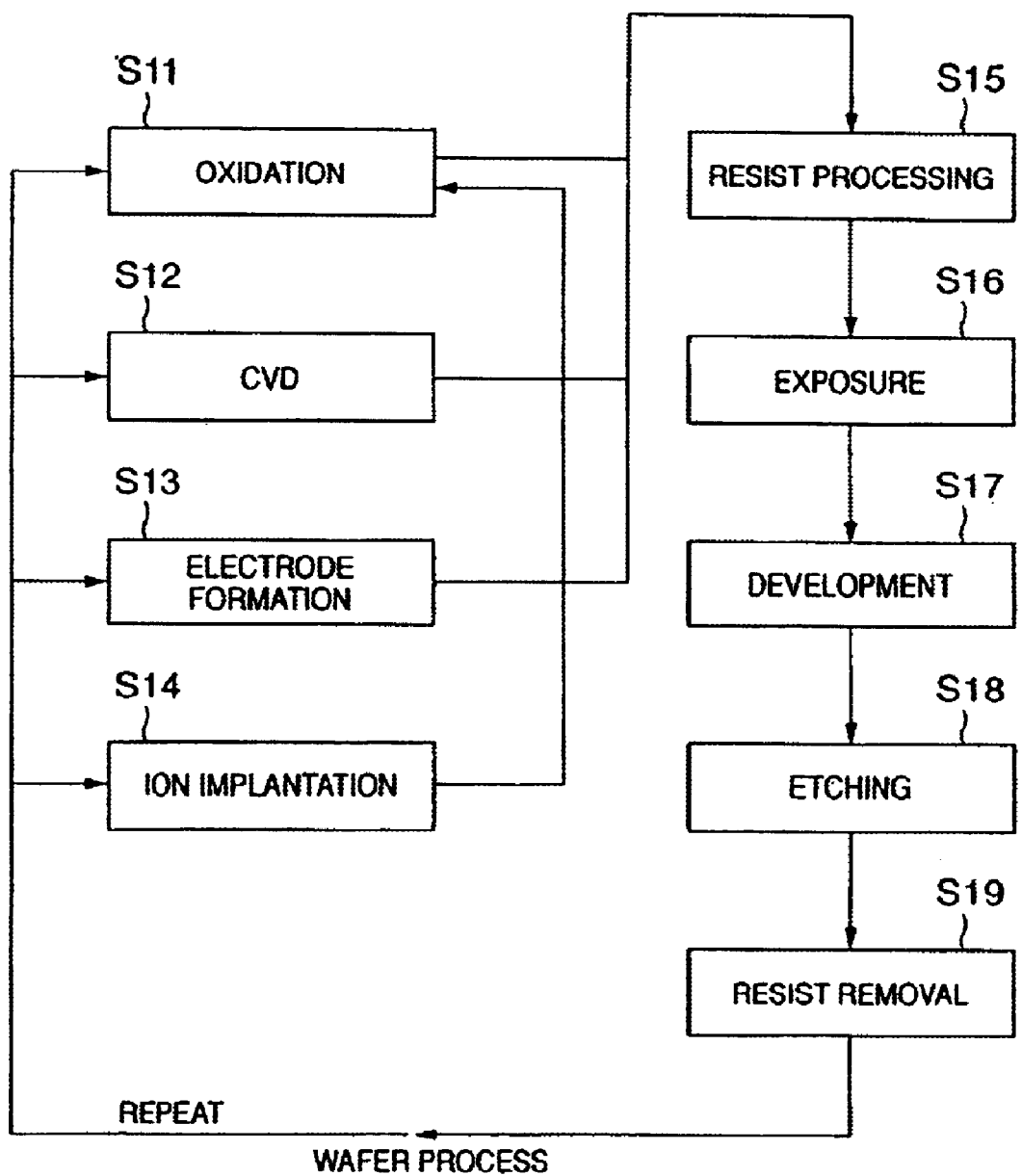
FIG. 15 is a flow chart showing the detailed flow of the wafer process.

FIG. 15 is a flow chart showing the detailed flow of the wafer process. In step 11 (oxidation), the surface of the wafer is oxidized. In step 12 (CVD), an insulating film is formed on the wafer surface. In step 13 (electrode formation), an electrode is formed on the wafer by vapor deposition. In step 14 (ion implantation), ions are implanted in the wafer. In step 15 (resist processing), a photosensitive agent is applied to the wafer. In step 16 (exposure), the circuit pattern is transferred to the wafer by using the above exposure apparatus. In step 17 (development), the exposed wafer is developed. In step 18 (etching), the resist is etched except for the developed resist image. In step 19 (resist removal), an unnecessary resist after etching is removed. These steps are repeated to form multiple circuit patterns on the wafer.

As described above, according to the present invention, the throughput can be improved.

As many apparently widely different embodiments of the present invention can be made without departing from the spirit and scope thereof, it is to be understood that the invention is not limited to the specific embodiments thereof except as defined in the claims.

What is claimed is:

1. A stage apparatus having a detachable substrate holding unit which chucks and holds a substrate, comprising:
   a flat surface having a recess;
   a fixing member which fixes a projection support provided to said substrate holding unit onto the flat surface; and
   a chuck/hold force mechanism which applies a chuck/hold force to said fixing member,
   wherein said substrate holding unit is supported by said fixing member while a distal end of said projection support is in contact with the recess of the flat surface and the other portion of said substrate holding unit is not in contact with the flat surface, and said substrate holding unit is supported via said fixing member with the chuck/hold force.

2. The apparatus according to claim 1, wherein said fixing member has a mechanism which applies no moment force to said projection support.

3. The apparatus according to claim 1, wherein the recess is a V shaped groove, and said projection support comes into point contact with the V shaped groove at a distal end thereof.

4. The apparatus according to claim 1, wherein said projection support comprises at least three projection supports and said fixing member fixing said projection supports respectively.

5. The apparatus according to claim 1, wherein said projection support and said fixing member form one component.

6. The apparatus according to claim 1, wherein said fixing member is fixed to said projection support.

7. The apparatus according to claim 1, wherein said fixing member can tilt freely at a contact portion with said projection support in an axial direction of said projection support and in a planar direction.

8. The apparatus according to claim 1, wherein a small gap is present between said projection support and said fixing member, and said projection support can tilt freely in an axial direction of said projection support and in a planar direction because of the gap.

9. The apparatus according to claim 1, wherein said fixing member has either one of a circular shape, an elliptic shape, a shape similar to an ellipse, or a polygonal shape.

10. The apparatus according to claim 1, wherein said fixing member can elastically deform.

11. The apparatus according to claim 1, wherein said fixing member has an outer seal portion on an outer surface thereof, and said outer seal portion comes into contact with the flat surface to define a closed space.

12. The apparatus according to claim 11, wherein a seal member is arranged between said projection support and said fixing member.

13. The apparatus according to claim 3, wherein the V shaped groove is formed to extend in three directions on the flat surface at an angular interval of about 120°.

14. The apparatus according to claim 1, further having a chucking/holding mechanism which chucks and holds said projection support onto the flat surface.

15. The apparatus according to claim, 1, further having a chucking/holding mechanism which chucks and holds said projection support onto said substrate holding unit.

16. The apparatus according to claim 14, wherein said projection support can be removed from the flat surface by canceling a chucking/holding force from said chucking/holding mechanism.

17. The apparatus according to claim 15, wherein said projection support can be removed from said substrate holding unit by canceling a chucking/holding force from said chucking/holding mechanism.

18. The apparatus according to claim 14, wherein said chucking/holding mechanism uses either one of a negative pressure, the Coulomb force, and a magnetic force.

19. A stage apparatus having a substrate holding unit which chucks and holds a substrate, comprising:
    a flat surface having a projection support where said substrate holding unit is to be mounted; and
    a fixing member which fixes said projection support provided to the flat surface with a recess formed in said substrate holding unit, wherein
    said substrate holding unit is supported by said fixing member while the recess of said substrate holding unit is in contact with a distal end of said projection support and a remaining portion of said substrate holding unit is not in contact with the flat surface.

20. An exposure apparatus comprising:
    an optical system which projects exposure light irradiating a master having a pattern onto a substrate; and
    a stage apparatus having a substrate holding unit which holds the substrate or master, wherein
    said stage apparatus includes
    a stage,
    a flat surface which drives said substrate holding unit within a predetermined plane, and
    a fixing member which fixes a projection support formed on said substrate holding unit onto the flat surface, and
    said substrate holding unit is supported while a distal end of said projection support is in contact with the flat surface and said substrate holding unit is not in contact with the flat surface.

21. A semiconductor device manufacturing method comprising:
    an applying step of applying a photosensitive material on a substrate;
    an exposure step of transferring a pattern onto the substrate, applied with the photosensitive material in the applying step, by utilizing an exposure apparatus according to claim 20; and
    a developing step of developing the photosensitive material on the substrate where the pattern has been transferred in the exposure step.

22. A stage apparatus comprising:
    a substrate holding unit having a projection support;
    a stage having a recess, wherein said projection support is supported on the interior surface of the recess;
    a fixing member which is arranged on said stage and used for supporting said projection support; and
    a chuck/hold force mechanism which applies a chuck/hold force to said fixing member,
    wherein said substrate holding unit is detachable and supported via said fixing member with the chuck/hold force.

23. A stage apparatus having a detachable substrate holding unit which chucks and holds a substrate, comprising:
    a flat surface having a recess, wherein said flat surface is arranged on one of a stage and said substrate holding unit; and
    a fixing member which fixes a projection support provided to the other one of said stage and said substrate holding unit onto the flat surface; and
    a chuck/hold force mechanism which applies a chuck/hold force to said fixing member,
    wherein said substrate holding unit is supported by said fixing member while a distal end of said projection support is in contact with the recess of said flat surface and the other portion of said substrate holding unit is not contact with said flat surface, and said substrate holding unit is supported via said fixing member with the chuck/hold force.

* * * * *

UNITED STATES PATENT AND TRADEMARK OFFICE
CERTIFICATE OF CORRECTION

PATENT NO. : 6,965,428 B2
DATED : November 15, 2005
INVENTOR(S) : Yasuyo Muto et al.

It is certified that error appears in the above-identified patent and that said Letters Patent is hereby corrected as shown below:

Column 3,
Line 29, "fixed" should read -- fixes --.

Column 4,
Line 47, "projection" should read -- projections --.
Line 60, "likes," should read -- like, --.

Column 6,
Line 15, "affect" should read -- affecting --.
Line 16, "9 decreases." should read -- 9, decreases. --.

Column 8,
Line 34, "or the" should read -- or a --.

Column 10,
Lines 35 and 36, "V shaped" should read -- V-shaped --.
Line 57, "elliptic" should read -- elliptical --.

Column 11,
Line 1, "V" should read -- V- --.
Line 7, "claim, 1," should read -- claim 1 --.
Line 20, "the Coulomb" should read -- a Coulomb --.
Line 27, "wherein" should be deleted.
Line 28, "said substrate" should read -- wherein said substrate --.
Line 39, "includes" should read -- includes: --.

UNITED STATES PATENT AND TRADEMARK OFFICE
CERTIFICATE OF CORRECTION

PATENT NO. : 6,965,428 B2
DATED : November 15, 2005
INVENTOR(S) : Yasuyo Muto et al.

It is certified that error appears in the above-identified patent and that said Letters Patent is hereby corrected as shown below:

Column 12,
Line 32, "and" should be deleted.
Line 43, "not" should read -- not in --.

Signed and Sealed this

Twenty-fifth Day of April, 2006

JON W. DUDAS
*Director of the United States Patent and Trademark Office*